(12) United States Patent
Negishi et al.

(10) Patent No.: US 8,001,682 B2
(45) Date of Patent: Aug. 23, 2011

(54) INSULATION SUBSTRATE, POWER MODULE SUBSTRATE, MANUFACTURING METHOD THEREOF, AND POWER MODULE USING THE SAME

(75) Inventors: Takeshi Negishi, Saitama (JP); Toshiyuki Nagase, Gotenba (JP)

(73) Assignee: Mitsubishi Materials Corporation, Tokyo (JP)

( * ) Notice: Subject to any disclaimer, the term of this patent is extended or adjusted under 35 U.S.C. 154(b) by 1082 days.

(21) Appl. No.: 11/573,755

(22) PCT Filed: Aug. 16, 2005

(86) PCT No.: PCT/JP2005/014958
§ 371 (c)(1),
(2), (4) Date: Feb. 15, 2007

(87) PCT Pub. No.: WO2006/019099
PCT Pub. Date: Feb. 23, 2006

(65) Prior Publication Data
US 2007/0297162 A1    Dec. 27, 2007

(30) Foreign Application Priority Data

Aug. 17, 2004  (JP) ................. 2004-237304
Jul. 20, 2005  (JP) ................. 2005-210086

(51) Int. Cl.
*H05K 3/34* (2006.01)
*H05K 3/02* (2006.01)
*H05K 3/10* (2006.01)
*H01K 3/22* (2006.01)
*H01K 3/00* (2006.01)
*B23P 19/00* (2006.01)

(52) U.S. Cl. ......... 29/840; 29/846; 29/847; 29/848; 29/849; 29/739; 29/745

(58) Field of Classification Search .......... 29/840, 29/739, 745, 846–849
See application file for complete search history.

(56) References Cited

U.S. PATENT DOCUMENTS
5,041,342 A * 8/1991 Umeda et al. ............ 428/632
(Continued)

FOREIGN PATENT DOCUMENTS
EP    0935286    * 8/1999
(Continued)

OTHER PUBLICATIONS

International Search Report for PCT/JP2005/014958 mailed Sep. 13, 2005.
(Continued)

*Primary Examiner* — A. Dexter Tugbang
*Assistant Examiner* — David P Angwin
(74) *Attorney, Agent, or Firm* — Leason Ellis LLP.

(57) ABSTRACT

A high-efficiency production method for a power module substrate with reduced line width of a conductive pattern provides an insulation substrate suitable for realizing a large current and a high voltage of a power module. According to the method, a brazing sheet is temporarily fixed on a first surface of a ceramics substrate by surface tension of a volatile organic liquid. The brazing sheet is also temporarily fixed on the first surface of a conductive pattern member punched from a base material by surface tension of same type of volatile organic liquid. The brazing sheet and the conductive pattern member are heated so as to volatilize the volatile organic liquid and a pressure is applied to the conductive pattern member in its thickness direction. The brazing sheet is melted to join the conductive pattern member with the first surface of the ceramics substrate.

4 Claims, 4 Drawing Sheets

U.S. PATENT DOCUMENTS 6,197,618 B1 3/2001 Guillot et al.
2007/0274047 A1* 11/2007 Nagase et al. ............... 361/704

FOREIGN PATENT DOCUMENTS

| JP | 56164560 | 12/1981 |
| JP | 62-292261 | 12/1987 |
| JP | 2-208033 | 8/1990 |
| JP | 02-304958 | 12/1990 |
| JP | 6-216499 | 8/1994 |
| JP | 07-101785 | 4/1995 |
| JP | 11-186679 | 7/1999 |
| JP | 2953163 | 9/1999 |
| JP | 2003-332481 | 11/2003 |

OTHER PUBLICATIONS

European Search Report issued Feb. 15, 2010 for the corresponding European Patent Application No. 08162730.9.

* cited by examiner

|   | Ra[μm] | Ry[μm] | Rz[μm] |
|---|---|---|---|
| 1 | 3.8 | 36 | 22.6 |
| 2 | 3.0 | 20 | 15.3 |
| 3 | 4.0 | 23 | 17.2 |
| 4 | 4.8 | 23 | 17.9 |
| 5 | 3.3 | 24 | 16.9 |
| 6 | 2.7 | 18 | 13.8 |
| Ave. | 3.6 | 24 | 17.3 |
| max | 4.8 | 36 | 22.6 |
| min | 2.7 | 18 | 13.8 |
| Ave.−3σ | 5.9 | 42 | 26.2 |

INSULATION SUBSTRATE, POWER MODULE SUBSTRATE, MANUFACTURING METHOD THEREOF, AND POWER MODULE USING THE SAME

CROSS REFERENCE TO PRIOR APPLICATIONS

This is a U.S. national phase application under 35 U.S.C. §371 of International Patent Application No. PCT/JP2005/014958 filed Aug. 16, 2005, and claims the benefit of Japanese Application Nos. 2004-237304 filed Aug. 17, 2004, and 2005-210086 filed Jul. 20, 2005, all of which are incorporated by reference herein. The International Application was published in Japanese on Feb. 23, 2006 as International Publication No. WO/2006/019099 under PCT Article 21(2).

TECHNICAL FIELD

The present invention relates to an insulation substrate that is suitable for a power module used in a semiconductor device for controlling a large current and a high voltage, to a power module substrate, to a manufacturing method thereof, and to a power module using the same.

BACKGROUND ART

Such a power module generally includes a power module substrate having a ceramics substrate formed of AlN, $Al_2O_3$, $Si_3N_4$, or SiC and a conductive pattern, formed of pure aluminum or an aluminum alloy, provided on a surface of the ceramics substrate, a radiating element that is provided on the other surface of the ceramics substrate, a semiconductor chip, serving as a heating element, that is provided on an upper surface of the conductive pattern, and a cool sink that is provided on a lower surface of the radiating element. Heat from the heating element is dissipated to the outside through the radiating element and the cool sink.

Here, as disclosed in Japanese Patent No. 2953163, the conductive pattern is generally formed by joining a plate-shaped base material formed of pure aluminum or an aluminum alloy with the surface of the ceramics substrate by soldering or brazing, and then etching the base material. Such a conductive pattern formed by etching has a width to be gradually wider from the upper surface (heating element side) toward the lower surface (ceramics substrate side).

These days, a large-current, high-voltage, and compact power module, that is, a conductor having a narrower width constituting the conductive pattern and a narrower gap between the conductors is required.

First, in order to meet the former requirement, a conduction area of the conductive pattern needs to be increased. However, as for the large conduction area, since there is a limitation on design of the apparatus itself in which the power module is incorporated, the external size of the ceramics substrate cannot be increased, and thus the width and thickness of the conductor cannot be increased. In this case, as described above, if the conductive pattern is formed by etching, the width of a lower part of the conductor is increased by an increased width. For this reason, compactness as the latter requirement cannot be achieved. Accordingly, there is a problem in that both requirements are not satisfied simultaneously.

The increase in the thickness of the conductor results in an increase in the number of steps of etching, and manufacturing costs of the power module may be increased.

Meanwhile, in a technical field different from a technical field to which the invention belongs, an invention that can solve the above-described problems is disclosed in Japanese Unexamined Patent Application, First Publication No. H11-186679. That is, in a method of manufacturing an insulation substrate having a base insulating layer, an adhesion insulating layer, and a conductive pattern in that order, a conductive pattern member (conductor) obtained by performing press punching on a plate material is placed in an aligned state on the surface of the adhesion insulating layer in a B stage state, then the adhesion insulating layer and the adhesion insulating layer are joined with other by pressing, and subsequently a conductive pattern is provided on the surface of the adhesion insulating layer. In the insulation substrate formed in such a manner, the substantially entire side surface (a surface rising from the surface of the adhesion insulating layer) of the conductor constituting the conductive pattern is exposed.

However, when the conductive pattern is formed by etching the base material, ad described above, there is a problem in that much processing time is required and high-efficiency production is rarely realized. Further, the conductive pattern formed by etching is gradually wider from the upper surface side (heating element side) toward the lower surface side (ceramics substrate side). Accordingly, it is difficult to meet the recent requirements for a compact power module and reduction in the line width of the conductive pattern.

Further, like the invention described in Japanese Unexamined Patent Application, First Publication No. H11-186679, if the conductive pattern member (conductor) is formed by press punching, the rear side in a cutting direction of the cut surface, that is, a first cut surface (two-third of the thickness) has smaller surface roughness, but the front side in the cutting direction, that is, a second cut surface (one-third of the thickness) has larger surface roughness. If the insulation substrate is formed by applying the invention described in the Japanese Unexamined Patent Application, First Publication No. H11-186679, the power module is formed using the insulation substrate, and then the resultant power module is used, the power module may not be appropriately used. For example, the rise of the second cut surface may become a singular point and a spark may occur in that portion as a start point or the conductor may be electrically connected to an adjacent conductor.

The invention has been finalized in consideration of the above problems, and it is an object of the invention to provide a method of manufacturing a power module substrate that can realize high-efficiency production and reduction in the line width of a conductive pattern.

It is another object of the invention to provide an insulation substrate that can realize a large current and a high voltage of a power module, suppress an increase of the size of an insulation substrate in such a configuration, and realize low-cost production, a method of manufacturing an insulation substrate, a power module substrate, and a power module.

SUMMARY OF THE INVENTION

In order to solve the above problems and achieve the above objects, the inventions according to aspects 1 to 3 (hereinafter, referred to as "the first group") provide a method of manufacturing a power module substrate by a conductive pattern through other methods than etching.

In particular, according to aspect 1, there is provided a method of manufacturing a power module substrate having a conductive pattern provided on a surface of a ceramics substrate. The method includes temporarily fixing a brazing sheet on the surface of the ceramics substrate by a surface tension of a volatile organic liquid, temporarily fixing a conductive pattern member punched from a base material on the other surface of the brazing sheet by the surface tension of the volatile organic liquid, heating the brazing sheet and the conductive pattern member so as to volatilize the volatile organic liquid, pressing at least the conductive pattern member in its thickness direction, and melting the brazing sheet to join the conductive pattern member with the surface of the ceramics substrate.

According to the method of manufacturing a power module substrate of the invention, after the temporarily fixation by the surface tension, the brazing sheet is melted to join the conductive pattern member with the surface of the ceramics substrate. Therefore, the conductive pattern can be provided on the surface of the ceramics substrate, without performing etching. As a result, high-efficiency production of the power module substrate and reduction in the line width of the conductive pattern can be realized.

According to aspect 2, in the method of manufacturing a power module substrate according to aspect 1, when the conductive pattern member is temporarily fixed on the surface of the ceramics substrate through the brazing sheet, in a state where the conductive pattern member punched from the base material is fitted into a punching hole, the conductive pattern member may be disposed to face the surface of the ceramics substrate, then the conductive pattern member may be pressed toward the surface of the ceramics substrate to be pulled out of the base material, and subsequently the conductive pattern member may be temporarily fixed on the surface of the ceramics substrate through the brazing sheet.

In this case, in a state where the conductive pattern member punched from the base material is fitted into the punching hole, the conductive pattern member is disposed to face the surface of the ceramics substrate, then the conductive pattern member is pressed toward the surface of the ceramics substrate to be pulled out of the base material, and subsequently the conductive pattern member is temporarily fixed on the surface of the ceramics substrate through the brazing sheet. Therefore, the conductive pattern member can be comparatively accurately and easily positioned and temporarily fixed a desired position on the surface of the ceramics substrate.

According to aspect 3, in the method of manufacturing a power module substrate according to aspect 2, the base material and the brazing sheet may be temporarily fixed by the surface tension of the volatile organic liquid in advance when the conductive pattern member is punched from the base material, and, in this state, the conductive pattern member may be punched together with the brazing sheet.

In this case, since conductive pattern member is punched from the base material together with the brazing sheet, when the conductive pattern member is joined with the ceramics substrate, occurrence of a phenomenon that the brazing filler metal is adhered to the ceramics substrate without reference to the conductive pattern member, which is called a stain, can be suppressed to the minimum, and a high-quality power module substrate can be formed.

The inventions according to aspects 4 to 9 (hereinafter, referred to as "the second group") provide an insulation substrate that prevents a spark due to a cut surface of a conductive pattern formed by press punching, a method of manufacturing an insulation substrate, a power module substrate, and a power module.

In particular, according to aspect 4, there is provided an insulation substrate including a conductive pattern that is provided on a surface of a ceramics substrate. Of an external surface of a conductor constituting the conductive pattern, a rising surface that rises from the surface of the ceramics substrate may substantially rise vertically with respect to a direction along the surface of the ceramics substrate. The conductive pattern may be joined with the surface of the ceramics substrate by a brazing filler metal. At least a lower part of the rising surface of the conductor in a direction in which the rising surface rises from the surface of the ceramics substrate may be covered with the brazing filler metal.

According to this configuration, since the conductor constituting the conductive pattern has the rising surface, even though the conductor is thickened so as to realize a large current and a high voltage conductive pattern, the conductor is suppressed from being widened by the increase of the thickness. Therefore, reduction of the line width of the conductive pattern, and a large current and a high voltage of the conductive pattern can be realized.

Further, since the conductive pattern is joined with the surface of the ceramics substrate by the brazing filler metal, and at least the lower part of the rising surface of the conductor constituting the conductive pattern is covered with the brazing filler metal, joining strength of the conductive pattern and the surface of the ceramics substrate can be improved. In addition, even though surface roughness of the lower part of the rising surface is large, since the surface is covered with the brazing filler metal, when the power module having the insulation substrate is used, it is possible to suppress occurrence of a situation that the power module is not appropriately used, for example, the rise of the surface at the lower part becomes a singular point and a spark occurs in that portion as a start point or the conductor is electrically connected to an adjacent conductor.

According to aspect 5, in the insulation substrate according to aspect 4, surface roughness of a lower part of the rising surface of the conductor in the direction in which the rising surface rises from the surface of the ceramics substrate may be larger than roughness of an upper part thereof.

According to this configuration, the surface roughness of the lower part (the surface of the conductor facing the ceramics substrate, that is, the lower surface) in the rising direction of the rising surface of the conductor is larger than the surface roughness of the upper part (the surface of the conductor opposite to the surface facing the ceramics substrate, that is, the upper surface). Therefore, a joining force of the brazing filler metal at the lower part of the conductor is increased, and thus joining strength of the conductive pattern and the surface of the ceramics substrate can be further improved.

According to aspect 6, in the insulation substrate according to aspect 4 or 5, arithmetic average roughness Ra of the surface of the brazing filler metal covering the rising surface may be less than 5 μm, the maximum height Ry thereof may be less than 40 μm, or ten-point average roughness Rz thereof may be less than 30 μm.

According to this configuration, the surface roughness of the brazing filler metal covering the rising surface is within the above range, and thus foreign substances can be suppressed from being adhered to the surface of the brazing filler metal, and occurrence of exterior defects of the insulation substrate can be reduced. In addition, adjacent conductors can be suppressed from being electrically connected to each other, that is, withstand voltage can be improved.

According to aspect 7, there is provided a method of manufacturing an insulation substrate that has a conductive pattern provided on a surface of a ceramics substrate. The method includes a conductive pattern member forming process of cutting a plate material in its thickness direction by a cutting processing and forming a conductive pattern member having a cut surface, a placing process of placing the conductive pattern member on the surface of the ceramics substrate through a brazing filler metal, such that the cut surface rises from the surface of the ceramics substrate from a front side in a cutting direction to a rear side, to form a laminate, and a joining process of pressing the laminate in a state where the laminate is heated in the lamination direction, and joining the ceramics substrate and the conductive pattern member by the brazing filler metal.

According to this configuration, in the conductive pattern member forming process, the conductive pattern member to be formed has the cut surface, and surface roughness of the rear side in the cutting direction of the cut surface is decreased while surface roughness of the front side is increased. In addition, in the subsequent placing process, the conductive pattern member on the surface of the ceramics substrate through a brazing filler metal, such that the cut surface rises from the surface of the ceramics substrate from a front side in the cutting direction having large surface roughness to a rear side in the cutting direction having small surface roughness, to form a laminate. Subsequently, in the subsequent joining process, the laminate is pressed in the lamination direction and then heated, and the conductive pattern member is joined with the surface of the ceramics substrate by the brazing filler metal.

In the joining process, the laminate is heated in a state where a front end in the cutting direction at the cut surface of the conductive pattern member is closely adhered to the brazing filler metal, and the brazing filler metal is melted. Accordingly, the brazing filler metal in a melted state including the brazing filler metal positioned in the periphery of the front end of the conductive pattern member is aggregated by the surface tension on the front side in the cutting direction of the cut surface having large surface roughness. In addition, the brazing filler metal gradually goes up the cut surface toward the rear side in the cutting direction. Therefore, the insulation substrate in which the substantially entire area of the rising surface is covered with the brazing filler metal is obtained.

Further, the brazing filler metal cured at the front end in the cutting direction of the cut surface of the conductive pattern member is thickest of the brazing filler metal covering the substantially entire area of the cut surface, and the external surface has a curved shape in side view. Therefore, even when the power module having such an insulation substrate is used under a temperature cycle, stress concentration can be reduced, and a crack can be suppressed from occurring at the joining surface of the conductive pattern and the surface of the ceramics substrate. As a result, it is possible to increase life span of the power module.

In addition, in the above-described manufacturing method, since the conductive pattern is not formed by etching, when the conductive pattern member is thickened in order to realize a large current and a high voltage of the power module, there is no case where the number of steps of etching is increased or the conductor constituting the conductive pattern is widened. Therefore, it is possible to provide a compact power module, which can realize a large current and a high voltage, at low cost.

According to aspect 8, a power module substrate includes an insulation substrate that has a conductive pattern provided on one surface of a ceramics substrate, a radiating element that is provided on the other surface of the ceramics substrate, and a heating element that is provided on a surface of the conductive pattern opposite to a surface facing the ceramics substrate. The radiating element dissipates heat from the heating element to the outside, and the insulation substrate is the insulation substrate according to any one of aspects 4 to 6.

According to aspect 9, a power module includes an insulation substrate that has a conductive pattern provided on one surface of a ceramics substrate, a radiating element that is provided on the other surface of the ceramics substrate, a heating element that is provided on a surface the conductive pattern opposite to a surface facing the ceramics substrate, and a cool sink that is provided on a surface of the radiating element opposite to a surface facing the ceramics substrate. Heat from the heating element is dissipated to the outside through the radiating element and the cool sink, and the insulation substrate is the insulation substrate according to any one of aspects 4 to 6.

According to the above configurations, reduction of the line width, and a large current and a high voltage of the conductive pattern can be realized, and simultaneously joining strength of the conductive pattern and the surface of the ceramics substrate can be improved. In addition, since the substantially entire surface of the rising surface of the conductor is covered with the brazing filler metal, when the power module having the insulation substrate is used, it is possible to suppress occurrence of a situation that the power module is not appropriately used, for example, the rise of the rising surface becomes a singular point and a spark occurs in that portion as a start point or the conductor is electrically connected to an adjacent conductor.

According to the method of manufacturing a power module substrate of the invention, the conductive pattern can be provided on the surface of the ceramics substrate, without performing etching. Therefore, high-efficiency production of the power module substrate and reduction of the line width of the conductive pattern can be realized.

Further, according to the insulation substrate, the power module substrate, and the power module of the invention, reduction of the line width, and a large current and a high voltage of the conductive pattern can be realized, and simultaneously joining strength of the conductive pattern and the surface of the ceramics substrate can be improved. In addition, even when occurs at the rising surface of the conductor, it is possible to suppress occurrence of a situation that the power module is not appropriately used.

In addition, according to the method of manufacturing an insulation substrate of the invention, it is possible to form an insulation substrate in which the substantially entire rising surface of the conductor constituting the conductive pattern is covered with the brazing filler metal. In addition, it is possible to form an insulation substrate in which, even when the power module having such an insulation substrate is used under a temperature cycle, stress concentration can be reduced, and a crack can be suppressed from occurring at the joining surface of the conductive pattern and the surface of the ceramics substrate. Further, it is possible to provide such a power module at low cost.

DETAILED DESCRIPTION OF THE INVENTION

Figure 1:
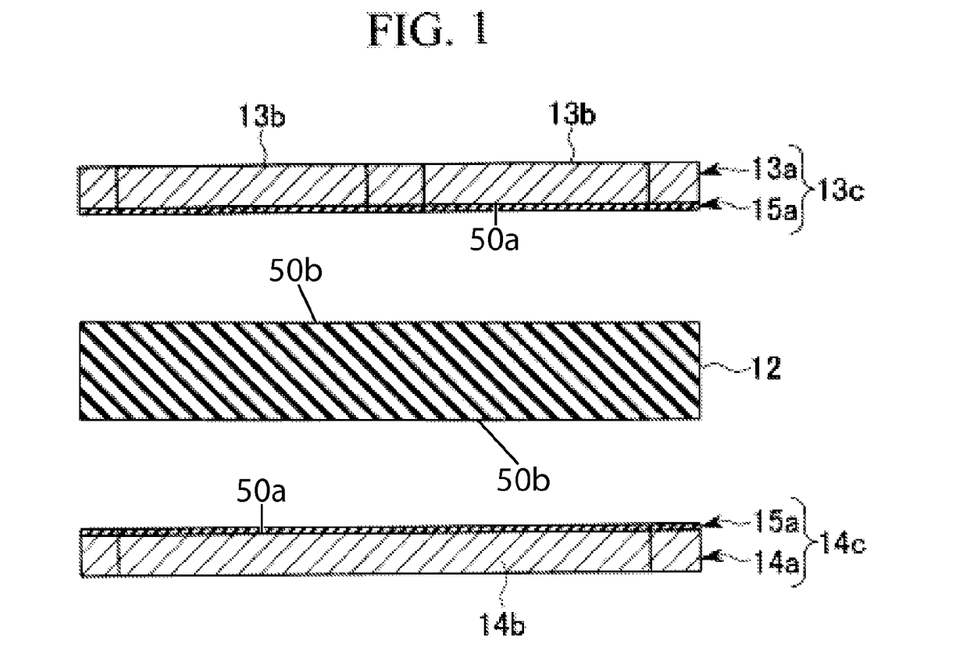
FIG. 1 is a first process view of a method of manufacturing a power module substrate according to an embodiment.
Figure 2:
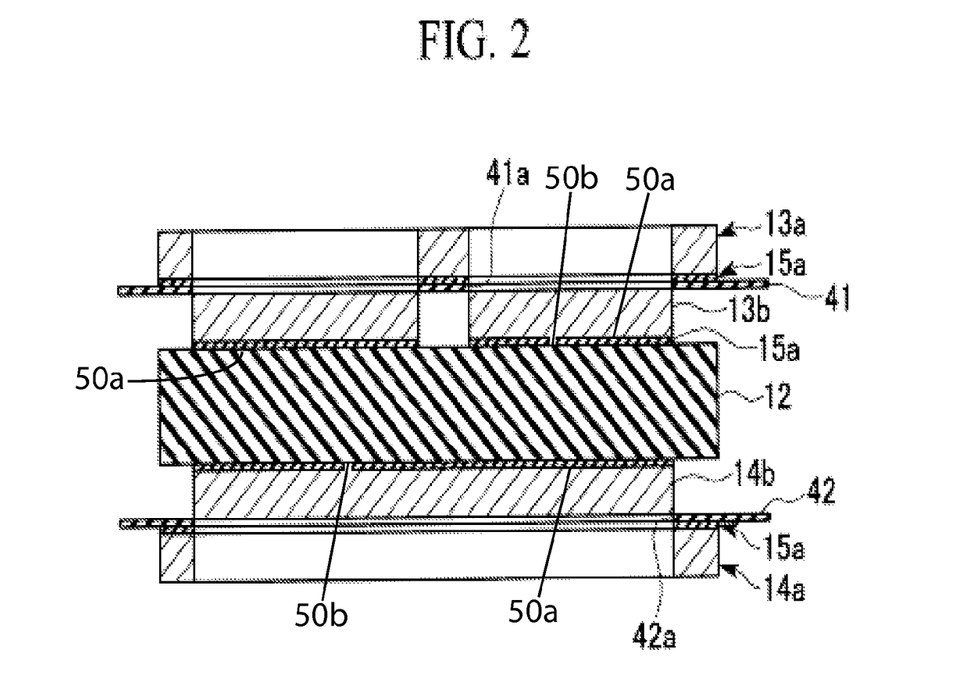
FIG. 2 is a second process view of the method of manufacturing a power module substrate according to the embodiment of FIG. 1.
Figure 3:
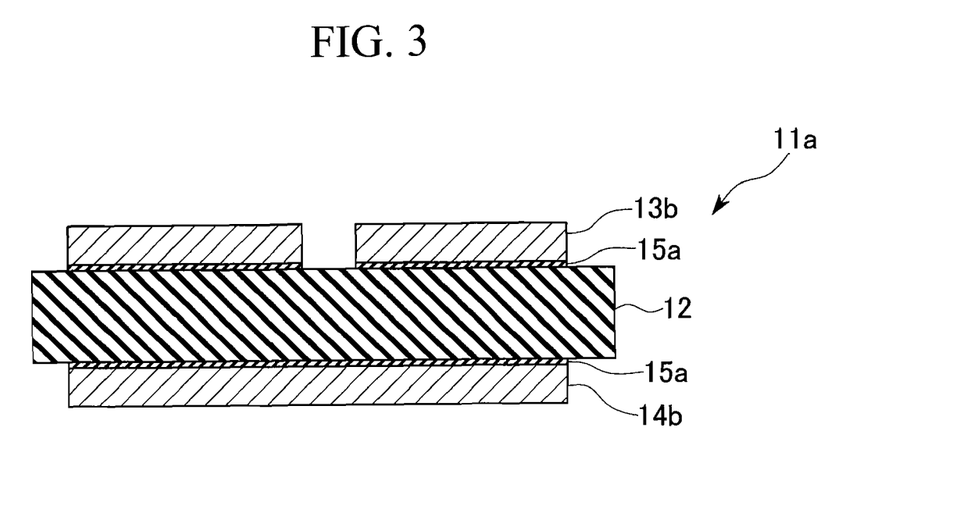
FIG. 3 is a third process view of the method of manufacturing a power module substrate according to the embodiment of FIG. 1.
Figure 4:
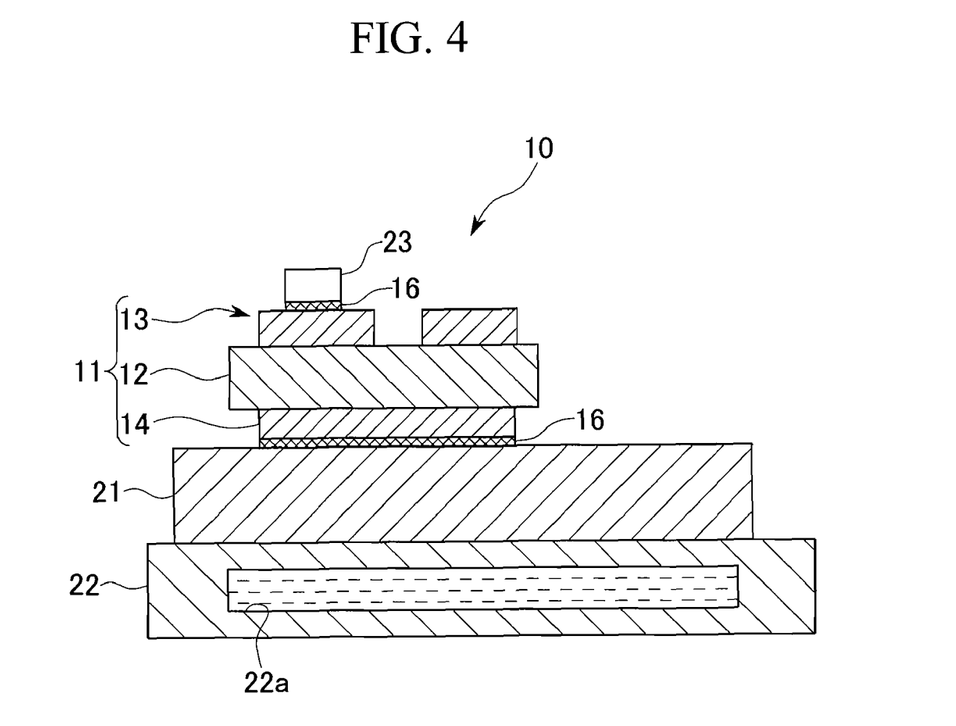
FIG. 4 is a schematic block diagram showing a power module to which the power module substrate formed through FIGS. 1 to 3 is applied.

Hereinafter, an embodiment according to the first group will be described with reference to the drawing. FIGS. 1 to 3 are process views a method of manufacturing a power module substrate according to the first group. FIG. 4 shows a power module 10 to which a power module substrate formed by the manufacturing method shown in FIGS. 1 to 3. The power module 10 includes a power module substrate 11, a radiating element 21, a cool sink 22, and a semiconductor chip 23 serving as a heating element.

In the power module substrate 11, a conductive pattern 13 is provided at an upper surface of a ceramics substrate 12 formed of AlN, $Al_2O_3$, $Si_3N_4$, or SiC, and a metal layer 14 is provided at a lower surface thereof. The conductive pattern 13 and the metal layer 14 are formed of pure aluminum or an aluminum alloy, and are joined with the ceramics substrate 12 by an Al—Si or Al—Ge brazing sheet 15a, as described below.

Then, the semiconductor chip 23 is joined with an upper surface of the conductive pattern 13 through a solder layer 16. Further, the radiating element 21 is provided at a lower surface of the metal layer 14, and the metal layer and the radiating element 14 and 21 are joined with each other by the solder layer 16, brazing, or diffusion joining. In addition, the cool sink 22 having formed therein a ventilating opening 22a, through which refrigerant, such as coolant or cooling air, flows, is provided at a lower surface of the radiating element 21. Moreover, the cool sink 22 and the radiating element 21 are screwed and fixed by, for example, screws (not shown), and the ventilating opening 22a is connected to a refrigerant circulating device (not shown) so as to supply and collect the refrigerant. Accordingly, heat from the semiconductor chip 23 can be dissipated to the outside through the radiating element 21 and the cool sink 22.

Next, a manufacturing method of the power module substrate 11 having the above-described configuration will be described with reference to FIGS. 1 to 3.

First, a volatile organic liquid 50a is uniformly coated on one surface of a first base material 13a formed of pure aluminum or an aluminum alloy, then an Al—Si or Al—Ge brazing sheet 15a is placed, and subsequently the brazing sheet 15a is temporarily fixed across one surface of the first base material 13a by the surface tension of the volatile organic liquid 50a. In this state, the first base material 13a is punched together with the brazing sheet 15a along the outer shape of the conductive pattern 13 to be formed, thereby forming a conductive pattern member 13b. The brazing sheet 15a is temporarily fixed across one surface of the conductive pattern member 13b by the surface tension substantially identical with the outer shape of the conductive pattern member 13b. As the conductive pattern member and the brazing sheet 13b and 15a are observed in plane view, the brazing sheet 15a protrudes from the outer edge of the conductive pattern member 13b. Then, the conductive pattern member 13b punched from the first base material 13a is fitted into a punching hole, thereby forming a first push-back member 13c.

As for a second base material 14a formed of aluminum or an aluminum alloy, like the first base material 13a, in a state where a brazing sheet 15a is temporarily fixed, the second base material 14a is punched together with the brazing sheet 15a along the outer shape of the metal layer 14 to be formed, thereby forming a metal layer member 14b. Then, the metal layer member 14b punched from the second base material 14a is fitted into a punching hole, thereby forming a second push-back member 14c.

Here, as the volatile organic liquids 50a and 50b, polyvalent alcohol, for example, divalent or trivalent alcohol is exemplified. Viscosity is $1\times10^{-3}$ Pas or more, and preferably, $20\times10^{-3}$ Pas to $1500\times10^{-3}$ Pas, and surface tension is $80\times10^{-3}$ N/m or less, and preferably, $20\times10^{-3}$ N/m to $60\times10^{-3}$ N/m. Further, the volatile organic liquids 50a and 50b are volatilized when a temperature is a melting temperature of the brazing sheet 15a or less, specifically, 400° C. or less, and preferably, 300° C. or less.

Next, as shown in FIG. 1, the first push-back member 13c is disposed above the ceramics substrate 12 such that the brazing sheet 15a faces the upper surface of the ceramics substrate 12, while the second push-back member 14c is disposed below the substrate 12 such that the brazing sheet 15a faces the lower surface of the ceramics substrate 12. Then, as shown in FIG. 2, a first template 41, in which a first guide hole 41a having an inner surface shape along the outer edge of the conductive pattern member 13b is formed, is disposed between the first push-back member 13c and the upper surface of the ceramics substrate 12. Further, a second template 42, in which a second guide hole 42a having an inner surface shape along the outer edge of the metal layer member 14b is formed, is disposed between the second push-back member 14c and the lower surface of the ceramics substrate 12.

At this time, the volatile organic liquid 50b is uniformly coated on the upper and lower surfaces of the ceramics substrate 12 or a surface of the brazing sheet 15a of the first push-back member 13c facing the upper surface of the ceramics substrate 12 and a surface of the brazing sheet 15a of the second push-back member 14c facing the lower surface of the substrate 12.

In this state, as for the first push-back member 13c, the conductive pattern member 13b is pressed against the upper surface of the ceramics substrate 12 to be pulled out of the first base material 13a, and simultaneously the conductive pattern member 13b is temporarily fixed on the upper surface of the ceramics substrate 12 through the brazing sheet 15a by the surface tension. Further, as for the second push-back member 14c, the metal layer member 14b is pressed against the lower surface of the ceramics substrate 12 to be pulled out of the second base material 14a, and simultaneously the metal layer member 14b is temporarily fixed on the lower surface of the ceramics substrate 12 through the brazing sheet 15a by the surface tension.

At this time, the outer edge of the conductive pattern member 13b is guided by an inner circumferential surface of the first guide hole 41a of the first template 41, and the outer edge of the metal layer member 14b is guided by an inner circumferential surface of the second guide hole 42a of the second template 42. Accordingly, upon pulling-out, the conductive pattern member 13b and the metal layer member 14b are inclined with respect to the surface of the ceramics substrate 12, such that occurrence of misalignment in a direction along the surface is suppressed.

In such a manner, the brazing sheet 15a and the conductive pattern member 13b are laminated on the upper surface of the ceramics substrate 12 in that order, and the brazing sheet 15a and the metal layer member 14b are laminated on the lower surface of the substrate 12. These members are temporarily fixed by the surface tension, thereby forming a laminate 11a.

Next, the laminate 11a is heated under an atmosphere of about 300° C. so as to volatilize the volatile organic liquids 50a and 50b, and the conductive pattern member 13b and the metal layer member 14b of the laminate 11a are pressed in the lamination direction for about one hour at about 0.3 MPa under an atmosphere of about 630° C. Then, the brazing sheets 15a are melted to join the conductive pattern member 13b and the metal layer member 14b with the surface of the ceramics substrate 12. In such a manner, the power module substrate 11, in which the conductive pattern 13 and the metal layer 14 are provided on the surface of the ceramics substrate 12, is formed.

As described above, according to the method of manufacturing a power module substrate of this embodiment, as described above, after the temporary fixation is performed by the surface tension of the organic liquid, the brazing sheet 15a is melted to join the conductive pattern member 13b with the surface of the ceramics substrate 12. Accordingly, the conductive pattern 13 can be provided on the surface of the ceramics substrate 12, without performing etching, and high-efficiency production of the power module substrate 11 and reduction of the line width of the conductive pattern 13 can be realized.

Further, in a state where the conductive pattern member 13b punched from the first base material 13c is fitted into the punching hole, the conductive pattern member 13b is disposed above the ceramics substrate 12, and then is pressed against the surface of the ceramics substrate 12 to be pulled out of the first base material 13c. Then, the conductive pattern member 13b is temporarily fixed on the surface of the ceramics substrate 12 through the brazing sheet 15a. Accordingly, the conductive pattern member 13b can be temporarily fixed at a desired position on the surface of the ceramics substrate 12 comparatively accurately and easily.

In addition, since the conductive pattern member 13b is punched from the first base material 13c together with the brazing sheet 15a, when the conductive pattern member 13b is joined with the surface of the ceramics substrate 12, occurrence of a phenomenon that the brazing filler metal is adhered to the ceramics substrate 12 without reference to the conductive pattern member 13b, which is called a stain, can be suppressed to the minimum, and a high-quality power module substrate 11 can be formed.

Figure 5:
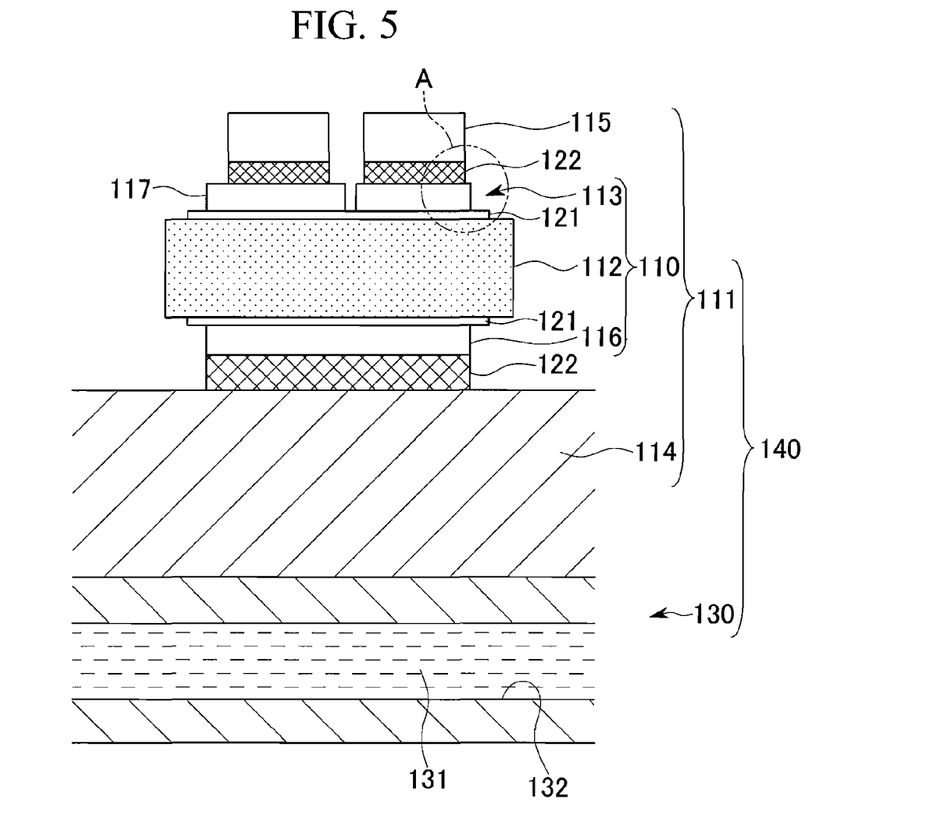
FIG. 5 is an overall view of a power module to which an insulation substrate according to a another embodiment is applied.

Next, another embodiment according to the second group will be described. FIG. 5 is an overall view showing a power module, to which an insulation substrate according to an embodiment of the invention is applied.

As shown in FIG. 5, a power module 140 roughly includes a power module substrate 11 and a cool sink 130.

The power module substrate 11 includes an insulation substrate 10, in which a conductive pattern 113 is provided on one surface (hereinafter, simply referred to as 'upper surface') of a ceramics substrate 112 formed of AlN, $Al_2O_3$, $Si_3N_4$, or SiC, a radiating element 114 that is provided on the other surface (hereinafter, simply referred to as 'lower surface') of the ceramics substrate 112, and a semiconductor chip (heating element) 115 that is provided on a surface (hereinafter, simply referred to as 'upper surface') of the conductive pattern 113 opposite to a surface facing the ceramics substrate 112.

Then, the cool sink 130 is closely provided on a surface (hereinafter, simply referred to as 'lower surface') of the radiating element 114 opposite to a surface (hereinafter, simply referred to as 'upper surface') facing the ceramics substrate 112.

Moreover, in this embodiment, a metal layer 116 is provided between the lower surface of the ceramics substrate 112 and the radiating element 114. That is, the insulation substrate 110 includes the ceramics substrate 112, the conductive pattern 113, and the metal layer 116.

The conductive pattern 113 and the metal layer 116 are formed pure Al or an Al alloy. Then, the conductive pattern 113 and the metal layer 116 are respectively joined with the upper and lower surfaces of the ceramics substrate 112 by an Al—Si or Al—Ge brazing filler metal 121.

Further, the semiconductor chip 115 is joined with the upper surface of the conductive pattern 113 by a solder 122, and the lower surface of the metal layer 116 (the surface facing the radiating element 114) is also joined with the upper surface of the radiating element 114 by the solder 122, brazing, or diffusion joining.

In such a manner, the power module 140 is formed, and heat from the semiconductor chip 115 is dissipated to the outside through the radiating element 114 and the cool sink 130.

Here, a ventilating opening 132 that is connected to a refrigerant circulating device (not shown) so as to supply and collect a refrigerant 131, such as a coolant or cooling air in the cool sink 130. Heat transferred from the semiconductor chip 115 to the radiating element 114 is collected by the refrigerant 131 supplied into the ventilating opening 132. Then, the refrigerant 131 that has collected heat is collected by the refrigerant circulating device, and a new refrigerant 131 is supplied. With the repetition of these operations, heat from the semiconductor chip 115 is dissipated from the power module 140.

Here, the thickness of the ceramics substrate 112 is 0.25 mm to 3.0 mm, the thickness of the conductive pattern 113 is 0.1 mm to 2.0 mm, and the thickness of the metal layer 116 is 0.1 mm to 2.0 mm. The thickness of the brazing filler metal 121 that joins the conductive pattern 113 and the metal layer 116 with the upper and lower surfaces of the ceramics substrate 112 is 0.005 mm to 0.1 mm.

Figure 6:
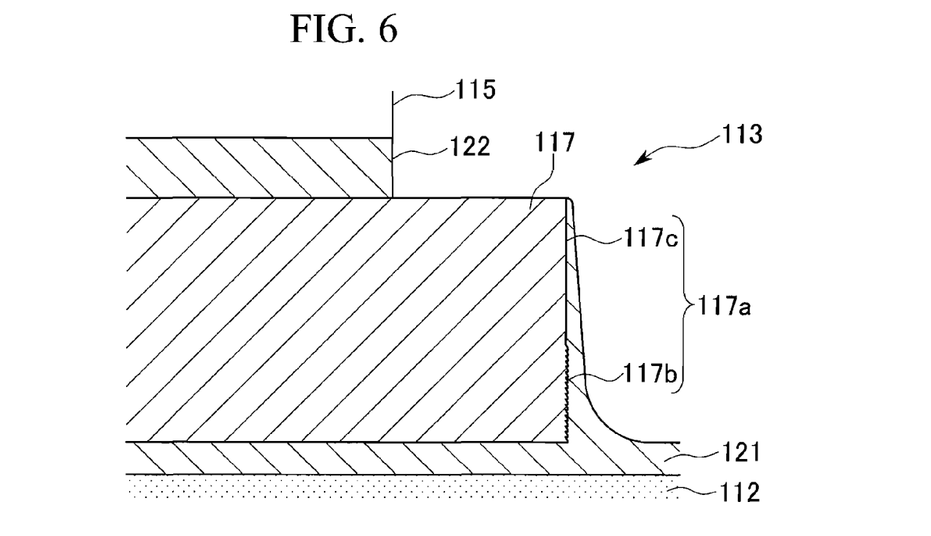
FIG. 6 is an enlarged view of an A portion shown in FIG. 5.

In this embodiment, the conductive pattern 113 has two plate-shaped conductors 117, and these conductors 117 are joined with the upper surface of the ceramics substrate 112 in an aligned state by the brazing filler metal 121. Moreover, a gap between the conductors 117 is 0.1 mm. Then, as shown in FIG. 6, of the external surface of each of the conductors 117, a rising surface 117a that rises from the upper surface of the ceramics substrate 112 substantially rises vertically with respect to a direction along the upper surface of the ceramics substrate 112. The substantially entire surface of the rising surface 117a is covered with the brazing filler metal 121.

Figure 7:
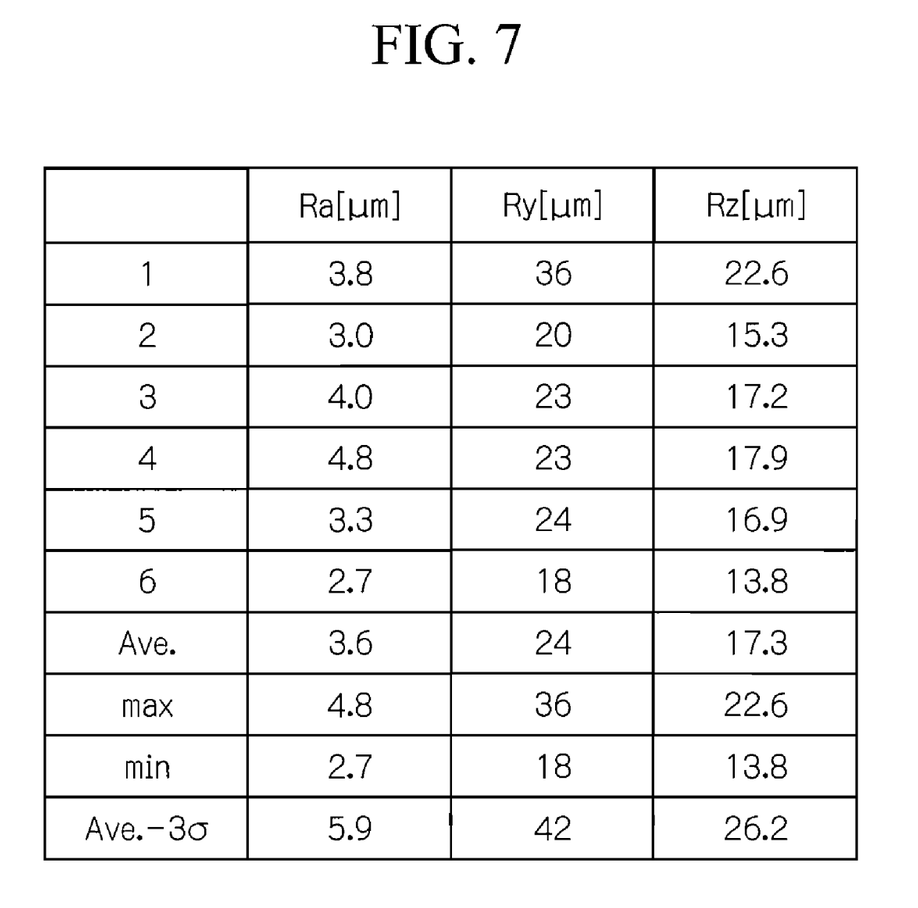
FIG. 7 is a table showing the measurement results of Ra, Ry, and Rz of a brazing filler metal covering a rising surface shown in FIG. 5.

Here, as shown in FIG. 7, as for the surface of the brazing filler metal 121 covering the rising surface 117a, arithmetic average roughness Ra is less than 5 μm, maximum height Ry is less than 40 μm, and ten-point average roughness Rz is less than 30 μm. FIG. 7 shows the measurement results of Ra, Ry, and Rz at six places of a plurality of rising surfaces 117a covered with the brazing filler metal 121.

Further, as described below, the conductor 117 is formed by cutting a plate material formed of pure Al or an Al alloy in its thickness direction, and a cut surface obtained at that time becomes the rising surface 117a. Then, the rising surface 117a rises from the upper surface of the ceramics substrate 112 from the front side in the cutting direction upon cutting of the conductor 117 to the rear side.

Here, in the rising surface 117a, upon cutting, surface roughness of a front side 117b in the cutting direction is larger than surface roughness of a rear side 117c in the cutting direction. In the rising surface 117a, the rear side 117c in the cutting direction refers to a region of one-third of the total thickness of the conductor 117 from the front end of the rising surface 117a in the cutting direction to the rear side 117c, that is, a so-called second cut surface. Further, the rear side 117c in the cutting direction refers to a region from a rear end in the cutting direction of the front side 117b in the cutting direction to the rear end in the cutting direction of the rising surface 117a, that is, a so-called first cut surface. Moreover, surface roughness Rz of the front side 117b in the cutting direction is 30 μm or more, and surface roughness Rz of the rear side 117c in the cutting direction is 30 μm or less.

Therefore, in the rising surface 117a of the conductor 117, surface roughness of the lower part 117b in a rising direction in which the rising surface 117a rises from the upper surface of the ceramics substrate 112 (the surface of the conductor 117 facing the ceramics substrate 112, that is, the lower surface) is more than surface roughness of the upper part 117c (the upper surface of the conductor 117).

Then, of the brazing filler metal 121 covering the substantially entire area of the rising surface 117a, the brazing filler metal 121 that is located at the lower end on the lower part 117b of the rising surface 117a has the maximum thickness, and the external surface thereof has a concave curve shape, as shown in FIG. 6.

Next, a method of manufacturing the insulation substrate 110 of the power module 140 having the above-described configuration will be described.

First, a plate material formed of pure Al or an Al alloy is cut to have a predetermined size in its thickness direction by cutting, thereby forming the conductor 117 (conductive pattern member) (conductive pattern member forming process). The cut surface obtained at this time becomes the rising surface 117a.

Next, the conductor 117 is placed on the upper surface of the ceramics substrate 112 through the brazing filler metal 121 in a desired aligned state such that the rising surface 117a rises from the upper surface of the ceramics substrate 112 from the front side 117b in the cutting direction toward the rear side 117c. Meanwhile, the metal layer 116 is placed on the lower surface of the ceramics substrate 112 through the brazing filler metal 121. In such a manner, the metal layer 116, the brazing filler metal 121, the ceramics substrate 112, the brazing filler metal 121, and the aligned conductor 117 are placed in that order, thereby forming a laminate (placing process).

Next, the laminate is heated while being pressed in the lamination direction and, in a state where the front end of the front side 117b in the cutting direction at the rising surface 117a of the conductor 117 and the brazing filler metal 121 are closely adhered to each other, the brazing filler metal 121 is melted and then cured. Then, the upper surface of the ceramics substrate 112 and the conductor 117 are joined with each other, and the lower surface of the ceramics substrate 112 and the metal layer 116 are joined with each other (joining process), thereby forming the insulation substrate 10.

Subsequently, if necessary, etching may be performed in order to clean the external surface of the insulation substrate 10.

Here, an example of the joining process will be described.

First, as for the material, the metal layer 116 is formed of pure Al, the brazing filler metal 121 is formed of Al—Si, the ceramics substrate 112 is formed of AlN, and the conductor 117 is formed of pure Al. Next, as for the thickness, the metal layer 116 is about 0.6 mm, the brazing filler metal 121 is about 0.01 mm, the ceramics substrate 112 is about 0.635 mm, and the conductor 117 is about 0.6 mm. Further, the gap between the conductors 117 is about 1.0 mm.

Next, the laminate is pressed in the lamination direction for one hour at 3 MPa while being placed in a vacuum of 630° C.

As described above, according to the insulation substrate, the power module substrate, and the power module of this embodiment, since the conductor 117 constituting the conductive pattern 113 has the rising surface 117a, even when a large current and a high voltage of the conductive pattern 113 is achieved by thickening the conductor 117, the conductor 117 is suppressed from being widened by an increase in thickness. Therefore, reduction of the line width, and a large current and a high voltage of the conductive pattern 113 can be realized.

Further, the conductive pattern 117 is joined with the upper surface of the ceramics substrate 112 by the brazing filler metal 121, and the substantially entire rising surface 117a of the conductor 117 is covered with the brazing filler metal 121. Therefore, joining strength of the conductive pattern 117 and the upper surface of the ceramics substrate 112 can be improved. In addition, even though surface roughness of the rising surface 117a of the conductor 117 is increased, since the surface is covered with the brazing filler metal 121, when the power module 140 having the insulation substrate 110 is used, it is possible to suppress occurrence of a situation that the power module 140 is not appropriately used, for example, the rise of the rising surface 117a becomes a singular point and a spark occurs in that portion as a start point or the conductor 117 is electrically connected to an adjacent conductor 117.

In addition, in the rising surface 117a of the conductor 117, surface roughness of the lower part 117b in the rising direction is larger than surface roughness of the upper part 117c. Therefore, a joining force of the brazing filler metal 121 at the lower part 117b of the conductor 117 is increased, and thus joining strength of the conductive pattern 113 and the upper surface of the ceramics substrate 112 can be further improved.

Further, since surface roughness of the brazing filler metal 121 covering the rising surface 117a is in the above-described range, foreign substances can be prevented from being attached to the surface of the brazing filler metal 121, and occurrence of exterior defects of the insulation substrate 110 can be reduced. In addition, adjacent conductors 117 can be suppressed from being electrically connected to each other, that is, withstand voltage can be improved.

In the joining process, in the rising surface 117a of the conductor 117, heating is performed in a state where the front end of the front side 117b in the cutting direction is closely adhered to the brazing filler metal 121, and then the brazing filler metal 121 is melted. The brazing filler metal 121 in the melted state including the brazing filler metal 121 located at a peripheral portion of the front end of the conductor 117 is aggregated by the surface tension at the front side 117b having large surface roughness. In addition, the brazing filler metal 121 gradually goes up toward the rear side 117c in the cutting direction of the rising surface 117a. Therefore, the insulation substrate 110, in which the substantially entire area of the rising surface 117a is covered with the brazing filler metal 121, can be formed.

As described above, since the melted brazing filler metal 121 reaches the substantially entire rising surface 117a of the conductor 117, of the brazing filler metal 121 covering the substantially entire area of the rising surface 117a, the brazing filler metal 121 cured at the front end of the front side 117b in the cutting direction has the maximum thickness. Further, the external surface has a concave curve shape in side view (a fillet is formed). Therefore, even when the power module 140 having the insulation substrate 110 is used under a temperature cycle, a crack can be suppressed from occurring at the joining surface of the conductive pattern 113 and the surface of the ceramics substrate 112. As a result, it is possible to increase life span of the power module 140.

In the method of manufacturing the insulation substrate 110 according to this embodiment, since the conductive pattern 113 is not formed by etching, when the conductive 117 is thickened in order to realize a large current and a high voltage of the power module 140, there is no case where the number of steps of etching is increased or the conductor constituting the conductive pattern is widened. Therefore, it is possible to provide a compact power module 140, which can realize a large current and a high voltage, at low cost.

Moreover, the technical scope of the invention is not limited to the embodiments, but various changes or modifications can be made within the scope departing from the spirit of the invention.

In the embodiment, there is described a method that temporarily fixes the brazing sheet 15a on the base materials 13a and 14a by the surface tension, and then pulls out the conductive pattern member 13b and the metal layer member 14b, together with the brazing sheet 15a. However, the present invention is not limited to this method, but the following method may be used.

For example, a push-back member not having the brazing sheet 15a is formed, the brazing sheet 15a is temporarily fixed on both surfaces of the ceramics substrate 12, and the push-back member is disposed to face both surface of the substrate 12. Then, the conductive pattern member 13b and the metal layer member 14b may be pulled out, thereby forming the laminate.

Further, the invention can be applied to a case where the templates 41 and 42 are not used.

Further, in the other embodiment, the rising surface 117a forms the cut surface, but is not necessarily limited to the cut surface.

When the rising surface 117a forms the cut surface, the advantages of the embodiment are obtained. In this case, however, the entire rising surface 117a does not necessarily form the cut surface. If at least one surface forms the cut surface, the same advantages as those in the embodiment can be obtained.

In the joining process, the brazing filler metal 121 in the melted state conductor 117 goes up the rising surface 117a from the lower surface toward the upper surface. At this time, the brazing filler metal 121 may reach the upper surface of the conductor 117.

The substantially entire surface of the rising surface 117a is covered with the brazing filler metal 121, but at least the front side 117b in the cutting direction of the rising surface 117a may be covered with the brazing filler metal 121.

In addition, in the embodiments, the arithmetic average roughness Ra is less than 5 μm, the maximum height Ry is less then 40 μm, and the ten-point average roughness Rz is less than 30 μm, but it may be sufficient that at least one of Ra, Ry, and Rz is in the above-described range.

The invention claimed is:

1. A method of manufacturing a power module substrate having a conductive pattern provided on a first surface of a ceramics substrate, the method comprising the steps of:
   temporarily fixing a brazing sheet on the first surface of the ceramics substrate by surface tension of a volatile organic liquid;
   temporarily fixing the brazing sheet on a first surface of a conductive pattern member punched from a base material by surface tension of same type of volatile organic liquid;
   heating the brazing sheet and the conductive pattern member so as to volatilize the volatile organic liquid;
   pressing at least the conductive pattern member in its thickness direction; and
   melting the brazing sheet to join the conductive pattern member with the first surface of the ceramics substrate.

2. The method of manufacturing a power module substrate according to claim 1,
   further including the step of punching the conductive pattern from the base material toward the first surface of the ceramics substrate so the conductive pattern member is temporarily fixed on the first surface of the ceramics substrate through the brazing sheet, the conductive pattern member is disposed to face the first surface of the ceramics substrate, and
   wherein the step of pressing is conducted so that the conductive pattern member is pressed toward the first surface of the ceramics substrate and subsequently the conductive pattern member is temporarily fixed on the first surface of the ceramics substrate through the brazing sheet.

3. The method of manufacturing a power module substrate according to claim 2,
   wherein the base material and the brazing sheet are temporarily fixed by the surface tension of the volatile organic liquid in advance when the conductive pattern member is punched from the base material, and, in this state, the conductive pattern member is punched together with the brazing sheet.

4. The method of manufacturing a power module substrate according to claim 2, wherein, during the step of punching the conductive pattern member is punched from the base material through a punching hole in a template.

* * * * *